US008752911B2

(12) United States Patent
Dernier et al.

(10) Patent No.: US 8,752,911 B2
(45) Date of Patent: Jun. 17, 2014

(54) ELECTRONIC APPARATUS AND ASSOCIATED DISASSEMBLY RELEASE TOOL

(75) Inventors: William Phillip Dernier, Indianapolis, IN (US); Eddie Bryant, Indianapolis, IN (US); William Bose, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 169 days.

(21) Appl. No.: 12/737,423

(22) PCT Filed: Jul. 15, 2008

(86) PCT No.: PCT/US2008/008606
§ 371 (c)(1),
(2), (4) Date: Jan. 12, 2011

(87) PCT Pub. No.: WO2010/008360
PCT Pub. Date: Jan. 21, 2010

(65) Prior Publication Data
US 2011/0115349 A1    May 19, 2011

(51) Int. Cl.
A47B 81/00    (2006.01)
A47B 97/00    (2006.01)
H05K 5/00    (2006.01)
H05K 7/00    (2006.01)
E05C 19/06    (2006.01)

(52) U.S. Cl.
USPC ............... 312/223.1; 361/679.01; 292/91

(58) Field of Classification Search
None
See application file for complete search history.

(56) References Cited

U.S. PATENT DOCUMENTS

| 3,720,432 | A | * | 3/1973 | Chudler | 292/220 |
| 3,996,500 | A | * | 12/1976 | Coules | 361/748 |
| 4,341,255 | A | * | 7/1982 | Mock | 160/369 |
| 4,410,931 | A | * | 10/1983 | DeCandia et al. | 362/267 |
| 4,722,025 | A | * | 1/1988 | Robinson | 361/212 |
| 5,113,331 | A | * | 5/1992 | Nagengast | 362/267 |
| 5,172,976 | A | * | 12/1992 | Bogdanovs | 362/374 |
| 5,197,789 | A | * | 3/1993 | Lin | 312/223.2 |
| 5,515,240 | A | * | 5/1996 | Rodeffer et al. | 361/759 |
| 5,551,589 | A | | 9/1996 | Nakamura | |

(Continued)

FOREIGN PATENT DOCUMENTS

EP    0522679 A2    3/1992
EP    1529731 A1    5/2005

(Continued)

OTHER PUBLICATIONS

Search report dated Oct. 29, 2008.

*Primary Examiner* — Hoa C Nguyen
*Assistant Examiner* — Xanthia C Cunningham
(74) *Attorney, Agent, or Firm* — Robert D. Shedd; Richard LaPeruta

(57) ABSTRACT

An apparatus comprises an enclosure having exterior walls defining an interior space; a top (10) having an interior surface (12) and a plurality of coupling clips (30) extending from the interior surface; and a base (5) having an inner surface (14). The base has a plurality of clip receiving members extending from the inner surface and reversibly engaging the coupling clips to secure the top to the base. The base further includes at least one aperture (7) adapted to permit a release fixture (50) having a plurality of decoupling members (40) extending from a plate (51) to simultaneously disengage the clip receiving members.

18 Claims, 7 Drawing Sheets

(56) References Cited

U.S. PATENT DOCUMENTS

| | | | | |
|---|---|---|---|---|
| 5,577,779 | A * | 11/1996 | Dangel | 292/80 |
| 5,743,606 | A * | 4/1998 | Scholder | 312/223.2 |
| 5,865,532 | A * | 2/1999 | Bonazzi | 362/374 |
| 6,006,941 | A * | 12/1999 | Hitchings | 220/284 |
| 6,297,948 | B1 * | 10/2001 | Buican et al. | 361/679.58 |
| 6,318,585 | B1 * | 11/2001 | Asagiri et al. | 220/788 |
| 6,367,896 | B1 * | 4/2002 | Peng et al. | 312/223.2 |
| 6,511,212 | B2 * | 1/2003 | Wang | 362/374 |
| 6,523,982 | B1 * | 2/2003 | Haddad | 362/375 |
| 6,717,814 | B2 * | 4/2004 | Li | 361/704 |
| 6,826,051 | B2 * | 11/2004 | Lai et al. | 361/704 |
| 7,198,149 | B2 * | 4/2007 | Gelardi | 206/1.5 |
| 7,208,686 | B1 * | 4/2007 | Chen et al. | 174/561 |
| 7,236,353 | B2 * | 6/2007 | Davidson et al. | 361/679.34 |
| 7,385,809 | B2 * | 6/2008 | Graffius | 361/679.55 |
| 7,413,479 | B1 * | 8/2008 | Volpone | 439/692 |
| 7,539,010 | B2 * | 5/2009 | Chen et al. | 361/679.55 |
| 7,540,575 | B2 * | 6/2009 | Mau | 312/223.2 |
| 7,735,669 | B2 * | 6/2010 | Liang | 220/4.21 |
| 2003/0202319 | A1 * | 10/2003 | Chen | 361/683 |
| 2004/0075282 | A1 | 4/2004 | Silverman et al. | |
| 2005/0040740 | A1 * | 2/2005 | Yun | 312/223.2 |
| 2005/0253032 | A1 * | 11/2005 | Pitlor | 248/206.5 |
| 2007/0115624 | A1 | 5/2007 | Knight | |
| 2008/0047112 | A1 * | 2/2008 | Hoekstra | 24/457 |
| 2008/0141504 | A1 * | 6/2008 | Wright | 24/592.11 |
| 2008/0263834 | A1 * | 10/2008 | Horimatsu et al. | 24/457 |
| 2009/0190291 | A1 | 7/2009 | Yamagiwa | |
| 2009/0223027 | A1 * | 9/2009 | Reznar et al. | 24/457 |
| 2009/0230827 | A1 * | 9/2009 | Macall | 312/223.1 |
| 2010/0008066 | A1 * | 1/2010 | Moro et al. | 362/97.1 |
| 2010/0107376 | A1 * | 5/2010 | Reznar et al. | 24/457 |

FOREIGN PATENT DOCUMENTS

| | | |
|---|---|---|
| JP | 11-354938 | 12/1999 |
| JP | 2001-359022 | 12/2001 |
| JP | 2004-148113 | 5/2004 |
| JP | 2007-005701 | 1/2007 |
| JP | 2007-142134 | 6/2007 |
| JP | 2008-034718 | 2/2008 |
| JP | 2009-176937 | 8/2009 |
| WO | WO2007/010963 | 1/2007 |

* cited by examiner

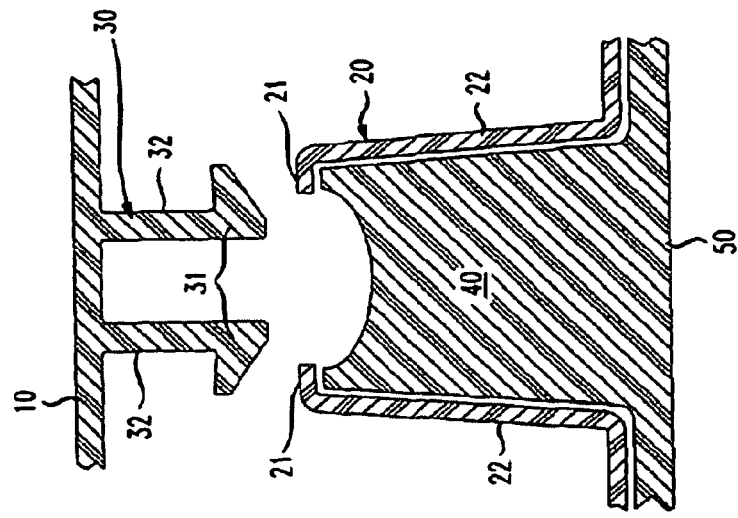
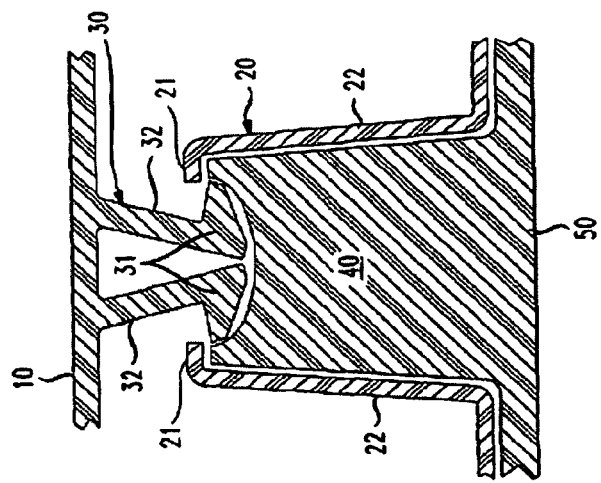
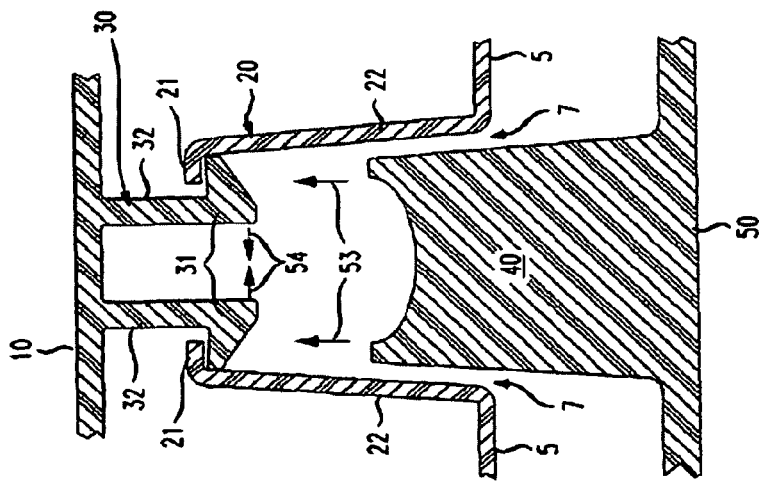

ELECTRONIC APPARATUS AND ASSOCIATED DISASSEMBLY RELEASE TOOL

This application claims the benefit, under 35 U.S.C. §365 of International Application PCT/US2008/008606, filed Jul. 15, 2008, which was published in accordance with PCT Article 21(2) on Jan. 21, 2010 in English.

FIELD OF THE INVENTION

The present invention relates to an electronic apparatus and an associated disassembly release tool designed to quickly and safely disassemble the electronic apparatus.

BACKGROUND

Electronic apparatuses or devices such as set-top boxes are typically assembled apparatuses having a plurality of walls wherein at least one of the walls is secured with plurality of screws. Unfortunately, gaining access to the interior components of these devices requires removing the plurality of screws which often requires excessive handling of the device. The excessive handling often will involve changing the orientation of the device, such as by turning the devices upside down or placing it on its sides, to find each of the screws. This is then followed by disassembling the device by removal of one screw at a time with the device being upside down or on its side. This excessive handling of the device increases chances of damaging the interior components because each motion of the device jars the components. Additionally, the removal and reengaging of the screws presents the opportunity for scratching the device or stripping threads of the screws.

In light of the fact that interior components of electronic devices often need to be accessed and that accessing the interior components can place the interior components at risk of damage or place the electronic device at risk for scratches, a need exists for an improved electronic device structure and method for opening the electronic device which is fast, simple, and safe.

The disclosed invention provides a means of safely and easily accessing the interior components of an electronic device without risk of damaging the components of the device. However, at the same time, the invention ensures that unauthorized access such as to children is substantially inhibited.

BRIEF SUMMARY

An apparatus 1 comprises an enclosure having exterior walls defining an interior space, a top 10 having an interior surface 12 and a plurality of coupling clips 30 extending from the interior surface, and a base 5. The base has an inner surface, a plurality of clip receiving members extending from the inner surface which engage the coupling clips to secure the top to the base. The base further includes at least one aperture 7 adapted to permit a release fixture 50 having a plurality of decoupling members 40 extending from a plate 51 to simultaneously disengage the clip receiving members.

A method of assembling the apparatus 1 comprises: pushing a base and top together by applying a vertical force; simultaneously contacting coupling clips 30 of the top 10 with clip receiving members 20 of the base 5: laterally repositioning grasping portions of the coupling clips; and snapping the grasping portions into their initial lateral positions or some intermediate positions such that there is a lateral and vertical overlap of portions of the coupling clips and part of the clip receiving members which causes the top and base to be reversibly assembled. The method further includes steps for dissembling the apparatus that comprise: aligning a release fixture to the base; applying a linear force to the release fixture to cause a plurality of decoupling members extending from a plate 51 of the release fixture 50 to enter apertures of the base; substantially simultaneously contacting the decoupling members to the grasping portions; laterally repositioning grasping portions of the coupling clips to disengage the grasping portions; and lifting off the top.

BRIEF DESCRIPTION OF THE DRAWINGS

FIG. 6 is a cross-section of the apparatus and release fixture according to the invention during various steps of disassembly of the apparatus.

DETAILED DESCRIPTION OF THE EMBODIMENTS

Figure 1:
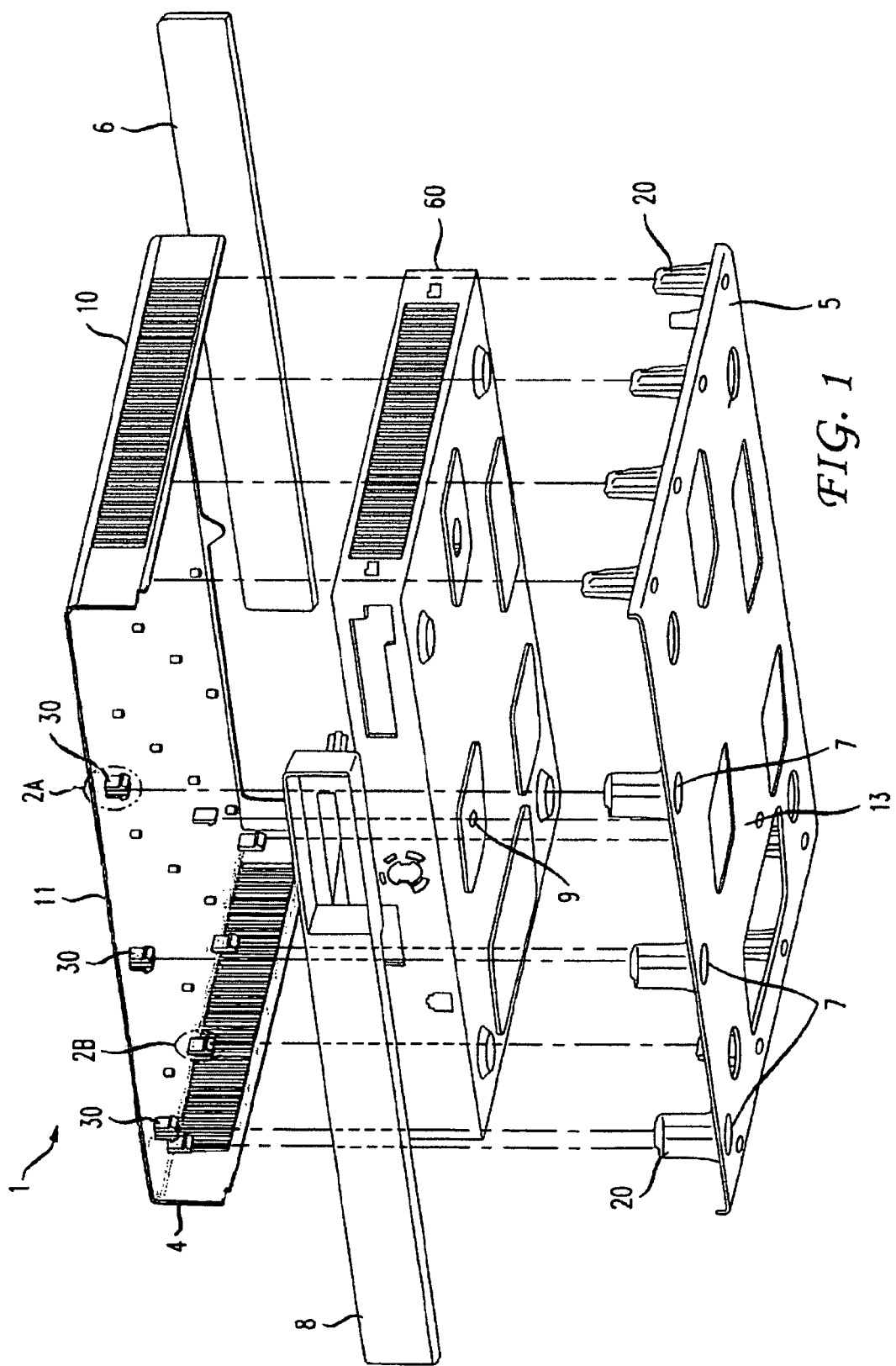
FIG. 1 is a perspective view of the apparatus according to the invention in a disassembled condition.

FIG. 1 shows the apparatus 1 according to the invention in a disassembled condition, wherein the apparatus can be an electronic apparatus such as a set-top box. The apparatus includes an enclosure having exterior walls defining an interior space, which houses various electronic components such as processors, smart card assemblies, tuners, fans, storage devices, etc. These components can be supported in an interior support structure 60 which itself can have side walls and a base. The exterior walls can be a front wall 8, rear wall 6, side walls 4, a top 10 and a base 5.

The base 5 has an inner surface opposite the out surface 13 and facing the top 10. The base further includes a plurality of clip receiving members 20 extending from the inner surface, which are designed to secure the base 5 to the top 10. The base 5 further includes a series of apertures 7 which are associated with the clip receiving members 20 and are adjacent or near the clip receiving members 20. In one embodiment, there is one aperture 7 for each clip receiving member. However, in other embodiments of the invention, single apertures 7 can be associated with and used for multiple clip receiving members 20.

The top 10 of the apparatus 1 includes an exterior surface and interior surface 12. The top 10 further includes a plurality of coupling clips 30 designed to engage or snap into the clip receiving members 20 of the base 5, which effectively secures the top 10 to the base 5.

The expression "snap" can imply either that some part of the coupling clips and/or some part of the clip receiving members are flexible or resilient to permit some lateral repositioning or motion of either part when a vertical force is applied pushing the base 5 and top 10 together to cause the coupling clips and/or some portion of the clip receiving members to contact. Further, the lateral repositioning or motion occurs upon the contact and can further increase as the coupling clips and/or some portion of the clip receiving members move further in opposite vertical directions with the force. As the force finally causes the top and base to be in a predetermined assembled state in terms of the separation dimension, the part of the coupling clip or clip receiving members which had been repositioned or moved returns to its initial lateral position or some intermediate position such that there is a lateral and vertical overlap of portions of the coupling clips and/or part of the clip receiving members (e.g. a shoulder) which causes the top and base to be assembled or fixed together, whereby the top and base cannot be separated in a nondestructive manner by opposite vertical forces that attempt to cause the top and base separate. "Snapping" is often assumed to imply rapid or immediate movement toward the initial state; however, the movement can be slow.

The interior support structure 60 can have holes or slots 9 which are also associated the apertures 7, where needed, to allow clearance for the clip receiving members 20.

Figure 2A:
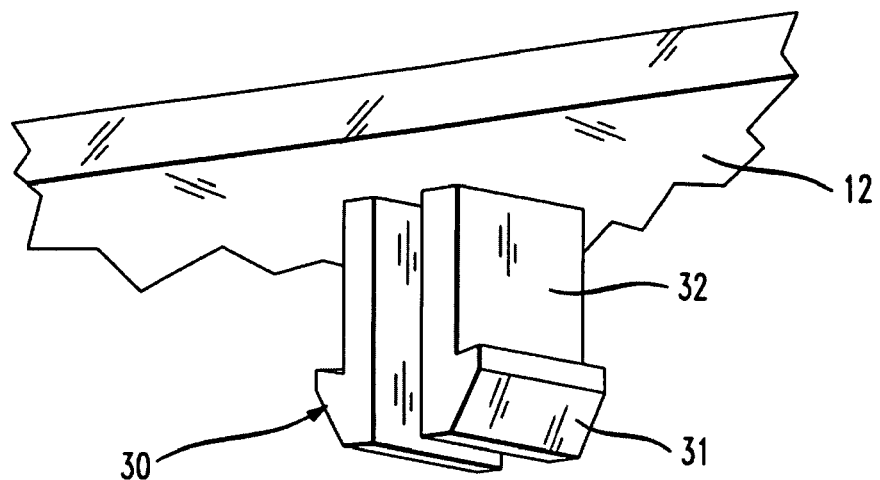
FIG. 2 is an exploded view of the coupling clips of the apparatus of FIG. 1.
Figure 2B:
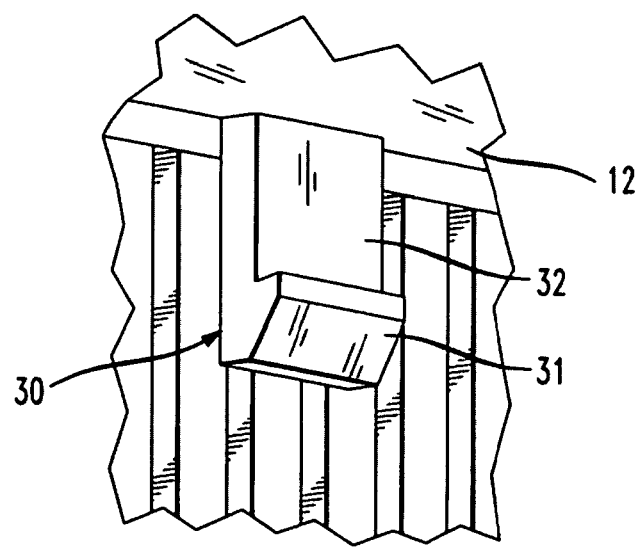

FIGS. 2A and 2B show examples of coupling clips 30. FIG. 2A shows a two-prong coupling clip 30 extending from the inner surface 12 of the top 5. Here, each prong has a grasping portion 31 at a distal end of a downwardly or inwardly extending portion 32. The grasping portion can have a shoulder and a sloped side extending down or away from the end of the shoulder and forming an acute angle with the shoulder. The slope side can be curved with at least part of the surface forming an acute angle with the shoulder. In FIG. 2A, the shoulders of the grasping portions extend away from one another. FIG. 2B shows an example of a one-prong coupling clip 30, wherein the one prong has a grasping portion 31 at a distal end of a downwardly or inwardly extending portion 32. This grasping portion 31 can also have be a shoulder and a sloped side extending from the end of the shoulder downwardly or away from the inner surface 12, wherein at least a portion of the sloped side forms an acute angle with the shoulder. The distal ends can extend at least two different lengths from the top. It should be pointed out that having grasping portions extending at least two different dimensions from the top makes it more difficult for unauthorized disassembly of the apparatus.

Figure 3:
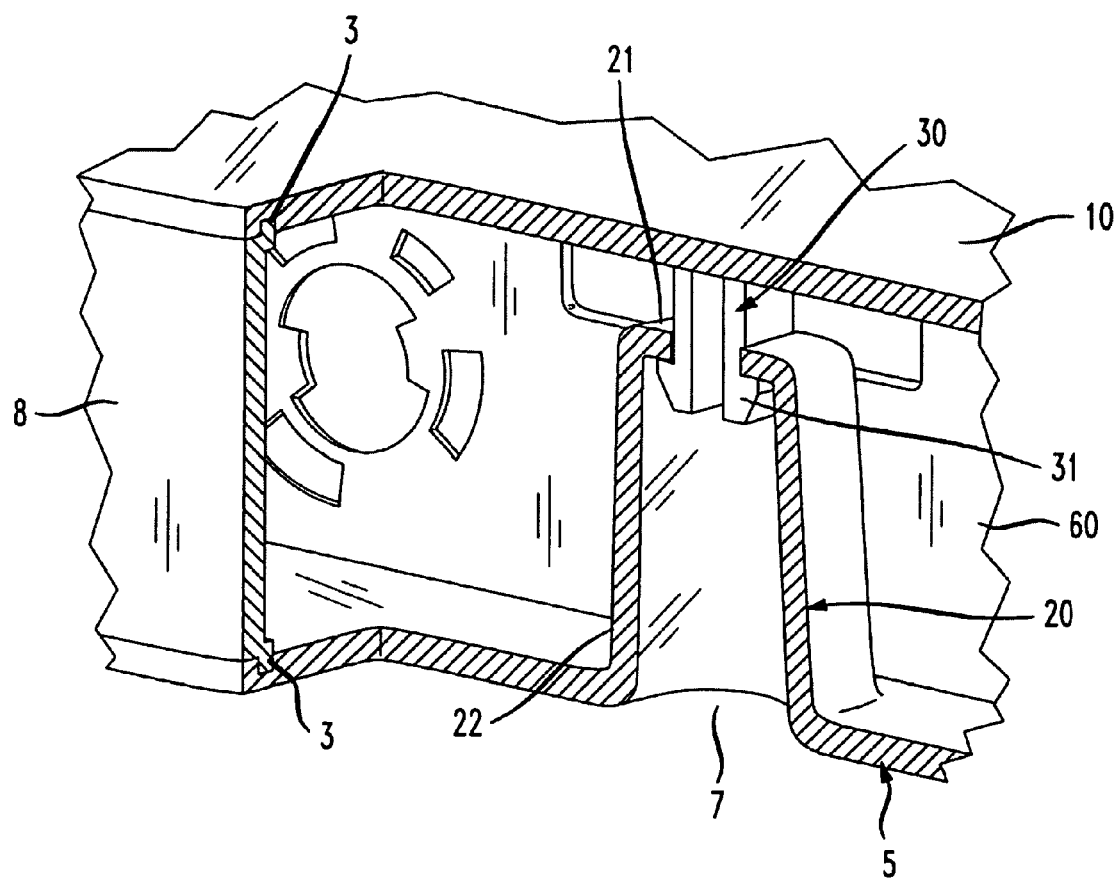
FIG. 3 is a perspective view of a coupling clip engaged in a clip receiving member of the assembled apparatus according to the invention.

FIG. 3 illustrates how the two-prong coupling clip 30 of FIG. 2A engages the clip receiving member 20 of the base 5. Here, the clip receiving member 20 extends from the base and has a shoulder 21 at a distal end of an upwardly or inwardly extending part 22. FIG. 3 shows an example of the aperture 7 which is formed in the base 5 and associated with the engagement of the illustrated coupling clip 30 and clip receiving member 20 is integrated with the base 5. For purposes of this invention, the distal end of the upwardly or inwardly extending part 22 refers to the location remote from the base where the shoulders 21 of the clip receiving member 20 extends; however, the actual structure of the clip receiving member 20 can have additional parts or an extension that extends passed the shoulder, wherein the distal end will still refer to the location remote from the base where the shoulder 21 of the clip receiving member 20 extends. The figure shows the grasping portions 31 snapped into the clip receiving member 20 by having the respective shoulders of the grasping portions 31 extending passed the shoulders of the shoulder 21 of the clip receiving members 20 and having the respective shoulders overlap and being contact with each other or in proximately to each other, thereby securing the top 10 to the base 5.

FIG. 3 also shows the front wall 8 being held into an assembled state by being positioned in slots 3 in the top 10 and base 5. This illustrates another feature of the invention which is that embodiments can include some or all of the walls being held into place by slots 3 in the top 10 and/or base 5. This feature is advantageous because it promotes less or no use of screws, which is an object of the invention.

Figure 4:
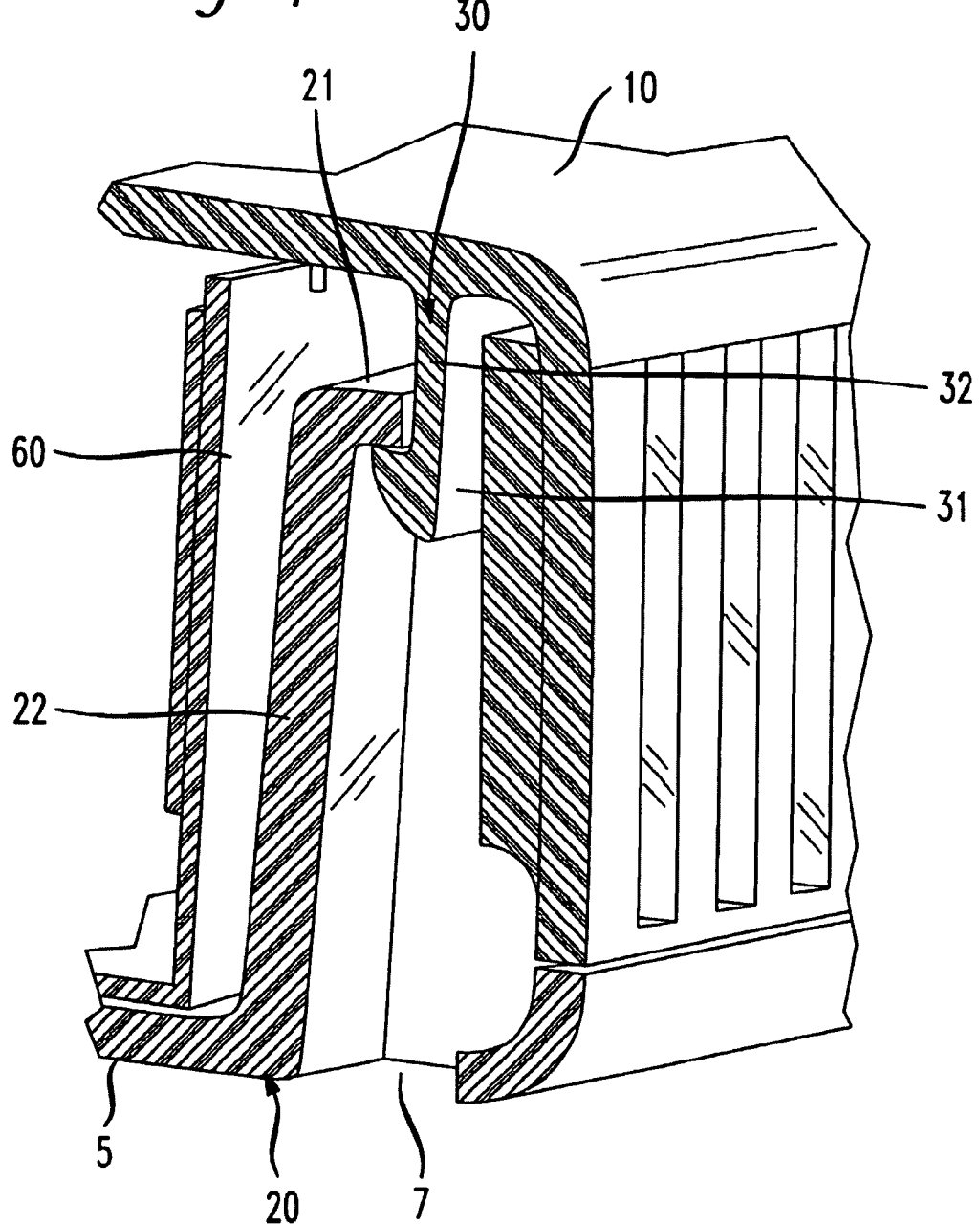
FIG. 4 is a perspective view of another coupling clip engaged in a clip receiving member of the assembled apparatus according to the invention.

FIG. 4 illustrates how the one-prong coupling clip 30 of FIG. 2B engages the clip receiving member 20 of the base 5. This figure also shows an aperture 7 which is formed in the base 5 and how it is associated with the engagement of the illustrated coupling clip 30 and clip receiving member 20. It is important to point out that for purposes of this invention an aperture can also be slot cut or formed into the base 5. Because the description of how the clip receiving member 20 engages the coupling clip 30 is the same as that in FIG. 3, further detailed description of such engagement is omitted here.

It is important to point out that a key feature of the invention is that there are plurality of coupling clip 30 and clip receiving member 20 engagements and that in a preferred embodiment, the engagements during assembly can be performed substantially simultaneously. The expression simultaneously is used in this invention to include situations where there can be some slack from one engagement to another such as the length of travel for one engagement can be 5% greater than the length on another engagement. The feature of having the engagements being simultaneous is advantageous because it prevents twisting or tilting of the top with respect to the base. Further elements of the inventions can include only one-prong coupling clips in the apparatus 1, only two-prong coupling clips, or a combination of both.

Figure 5:
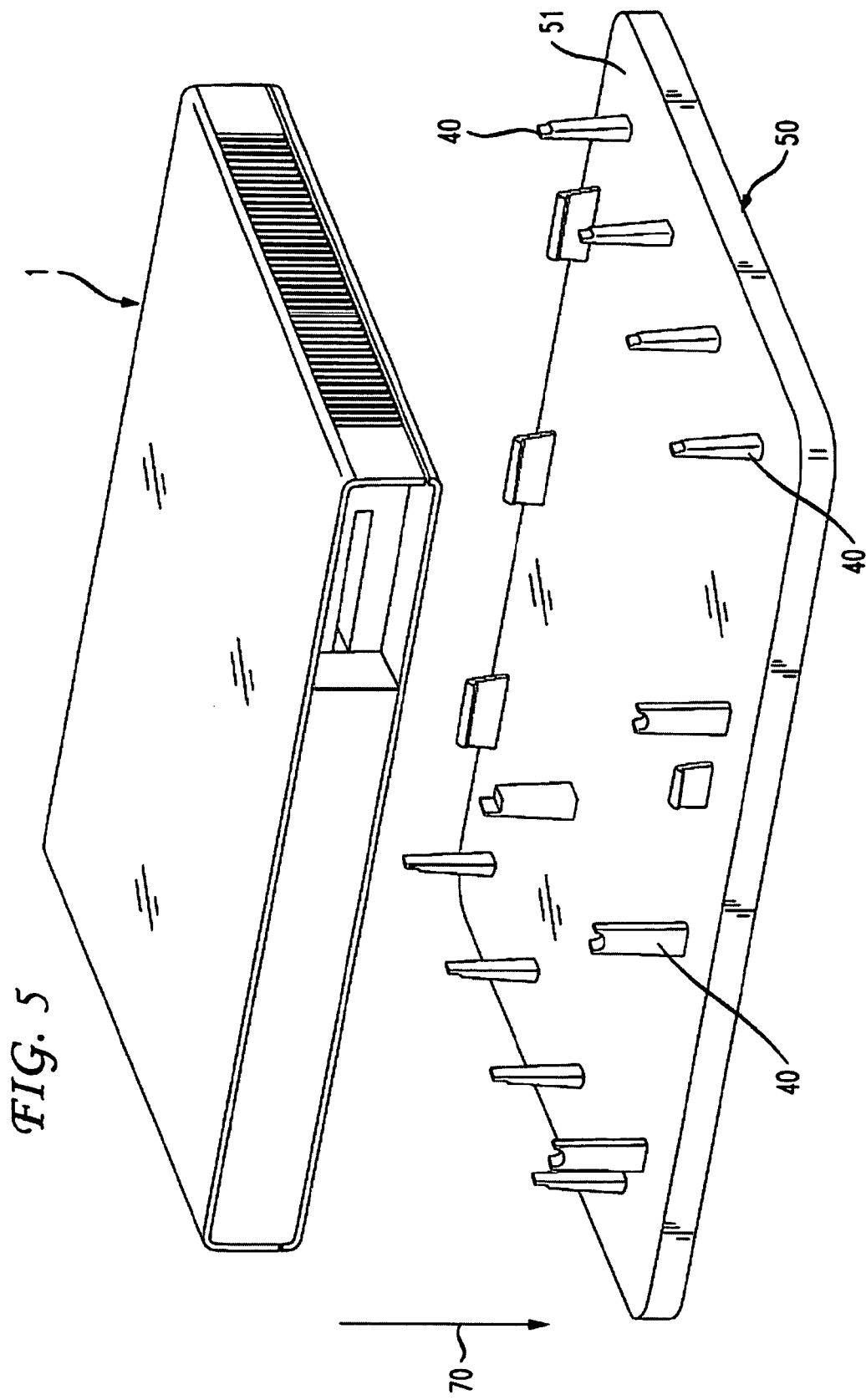
FIG. 5 is a perspective view of the assembled apparatus and a release fixture according to the invention.

FIG. 5 introduces another element of the invention which is that the apparatus can be designed to be able to be easily disassembled by use of a single tool in one simple and single linear motion 70 while the apparatus 1 is maintained in its normal operating orientation. Here, the tool is a release fixture 50 that has a plurality of decoupling members 40 extending from a plate 51 to simultaneously disengage the clipping clips 30 from the clip receiving members 20. The feature of having the disengagements being simultaneous is also advantageous because it prevents twisting or tilting of the top with respect to the base. The decoupling members 40 are each designed to align with apertures 7 and contact the coupling clips 30. To disassemble the apparatus 1, the release fixture 50 is placed on a flat surface, the apparatus 1 is aligned with the release fixture 50, and then in one motion the apparatus is placed and pushed toward the release fixture. The motion causes the decoupling members to disengage the coupling clips 30 from the clip receiving members 20 as shown in FIGS. 6 and 7.

FIG. 6 illustrates how the two-prong coupling clip 30 is disengaged during the single linear motion 70 in FIG. 5. FIG. 6A shows the decoupling member 40 as having a U-shape design with flat upper edges that contact the grasping portions 31 when the decoupling member 40 enters the aperture 7 and applies an upward or inward force 53. The force 53 causes the grasping portion to shift in direction 54 away from the upwardly extending part 22 such that the downwardly extending portion 32 bends and/or angles to a position where the shoulder of the grasping portion 31 clears or moves passed the shoulder 21 of the clip receiving member 20. FIG. 6B shows the positioning of the grasping portion 31 when its shoulder clears or moves passed the shoulder 21 of the clip receiving member 20 and the decoupling member 40 is fully inserted. At this point, the top 10 can be removed by simply lift it as shown in FIG. 6C. FIG. 6C shows the positioning of the grasping portion 31 of the coupling clips 30 when top is lifted, thereby allowing the components within the apparatus to be accessed.

It should also be pointed out that the assembly can be easily reassembled by simply placing the top 10 over the base 5 with the release fixture 50 removed and pressing the top 10 down or toward the base. Each of the coupling clips 30 will then be reengaged into the clip receiving members 20.

Figure 7A:
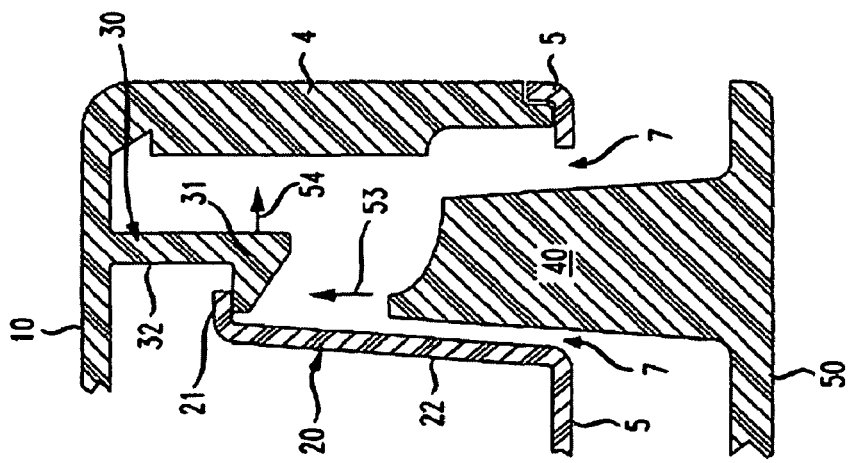
FIG. 7 is another cross-section of the apparatus and release fixture according to the invention during various steps of disassembly of the apparatus.
Figure 7B:
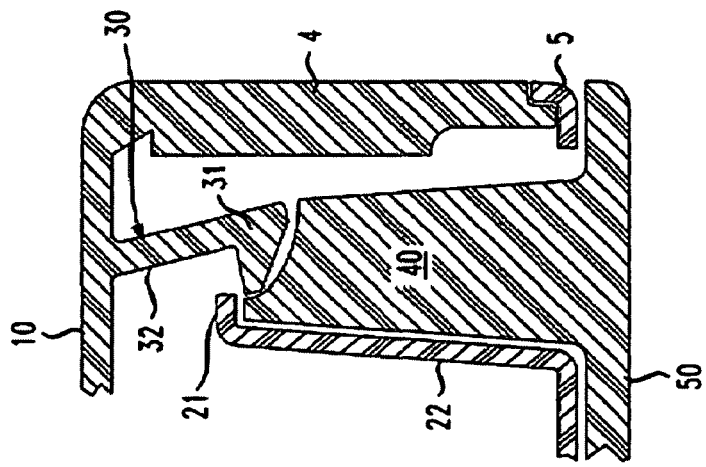
Figure 7C:
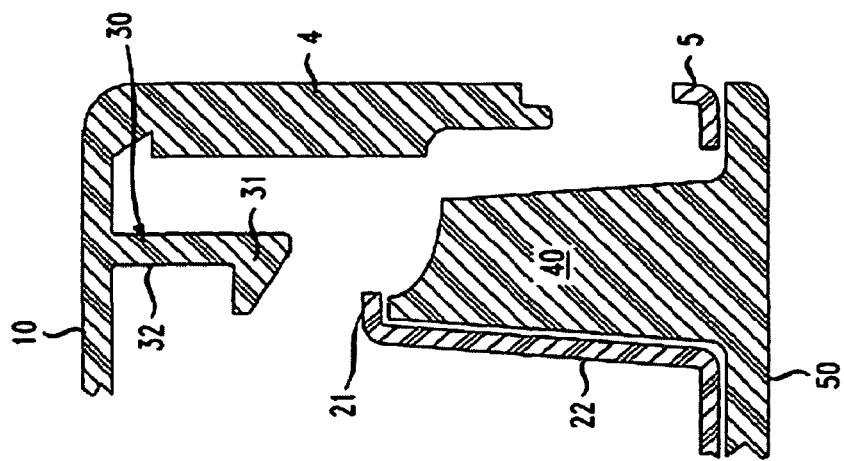

FIG. 7 illustrates how the one-prong coupling clip 30 is disengaged during the single linear motion 70 in FIG. 5. FIG. 7A shows the decoupling member 40 as having a narrow edge which has a width that can be the same dimension as the shoulder 21. The dimension is such that the narrow edge contacts the grasping portion 31 when the decoupling member 40 enters the aperture 7 and applies an upward or inward force 53 that causes the grasping portion to shift in direction 54 away from the upwardly extending part 22 causing the downwardly extending portion 32 to bend and/or angle to a position where the shoulder of the grasping portion 31 clears or moves passed the shoulder 21 of the clip receiving member 20. FIG. 7B shows the positioning of the grasping portion 31 of the one-prong coupling clip 30 when its shoulder clears or is moves passed the shoulder 21 of the clip receiving member 20 and the decoupling member 40 is fully inserted. At this point, the top 10 can be removed by simply lifting it as shown in FIG. 7C. FIG. 7C shows the positioning of the grasping portion 31 of the coupling clips 30 when top is lifted, thereby allowing the components within the apparatus to be accessed.

The invention can further be described as an apparatus comprising: a first wall having clips on an interior surface and a second wall having retainers or clip receiving members on an inner surface of the second wall, the inner surface of the second wall facing the interior surface and defining an interior space. The respective clips and retainers are engaged, aligned and oriented relative to one another such that all of the respective clips and retainers can be substantially simultaneously disengaged by a plurality of decoupling members having an alignment and orientation corresponding to the respective clips and retainers and adapted to be moved in unison. The plurality of clips and retainers can define a series of locks between the first wall and second wall. Further, the first wall or second wall can have apertures distributed therein to permit decoupling members to enter therethrough for disengagement of the plurality of clips and retainers locking the first wall and second wall together. The locks can extend at least two different lengths from the inner surface.

The foregoing illustrates some of the possibilities for practicing the invention. Many other embodiments are possible within the scope and spirit of the invention. For example, embodiments include the aspect of the top and base being in an assembled condition without the presence of screws. In other examples, the coupling clips can extend upward and coupling receiving members extend downward. Further examples can include the apertures 7 for the release structure being in the top 10. Further within the scope of the invention is the expressions "top" and "base" can describe an apparatus according to the invention in which the "top" is the lower part of the apparatus and the "base" is the upper part, whereby the interior components are corresponding reversed as well. It is, therefore, intended that the foregoing description be regarded as illustrative rather than limiting, and that the scope of the invention is given by the appended claims together with their full range of equivalents.

The invention claimed is:

1. An apparatus comprising:
    a first wall having a plurality of clips on an interior surface of the first wall;
    a second wall having a plurality of retaining members extending
    transversely from on an inner surface of the second wall, the inner surface of the second wall facing the interior surface of the first wall, the interior and inner surfaces defining an interior space;
    wherein protrusions extending transversely from the respective clips and retaining members are engaged, aligned and oriented relative to one another such that all of the respective clips and retaining members are substantially simultaneously disengaged by a plurality of decoupling members having an alignment and orientation corresponding to the respective clips and retaining members and adapted to be moved in unison in a direction parallel to the alignment and orientation of the respective clips and retaining members.

2. The apparatus of claim 1, wherein the plurality of clips and retaining members define a series of locks between the first wall and second wall.

3. The apparatus of claim 1, wherein the first wall or second wall have apertures distributed therein to permit decoupling members to enter therethrough for disengagement of the plurality of clips and retaining members locking the first wall and second wall together.

4. The apparatus of claim 1, wherein the apparatus is an electronic apparatus.

5. The apparatus of claim 4, wherein the electronic apparatus is a set-top box.

6. The apparatus of claim 2, wherein the locks extend at at least two different lengths from the inner surface.

7. The apparatus of claim 1, wherein the first wall or second wall have apertures distributed therein to permit decoupling members to enter therethrough for disengaging the plurality of clips and retaining members locking the first wall and second wall together, wherein the apertures are adapted to permit a release fixture having the plurality of decoupling members extending from a plate to substantially simultaneously disengage the plurality of retaining members.

8. An apparatus comprising:
    an enclosure having exterior walls defining an interior space;
    a top having an interior surface and a plurality of coupling clips extending from the interior surface; and
    a base having an inner surface and a plurality of clip receiving members extending transversely from the inner surface, protrusions extending transversely from the clip receiving members reversibly engaging protrusions extending transversely from the coupling clips to secure the top to the base, the base further including at least one aperture adapted to permit a release fixture having a plurality of decoupling members extending from a plate to simultaneously disengage the clip receiving members when the decoupling members are inserted in a direction parallel to the alignment and orientation of the respective clips and clip receiving members.

9. The apparatus of claim 8, wherein the protrusions from the coupling clips are at distal ends of inwardly extending portions that extend from the top.

10. The apparatus of claim 9, wherein the protrusions from the coupling clips are at least two different distances from the top.

11. The apparatus of claim 9, wherein the distal ends extend at least two different lengths from the top.

12. The apparatus of claim 8, wherein the apparatus further comprises:

the clip receiving members including inwardly extending parts extending from the inner surface and shoulders at distal ends of inwardly extending parts, and portions of the coupling clips laterally and vertically overlapping the shoulders.

13. The apparatus of claim 12, wherein at least one coupling clip is a two-prong configuration.

14. The apparatus of claim 8, wherein the clip receiving members extend from the base and have shoulders at distal ends of inwardly extending parts, and the protrusions from the coupling clips being snapped into the clip receiving members by having respective shoulders of the protrusions from the coupling clips extending passed the shoulders of the clip receiving members and having the respective shoulders overlap and being in contact with each other or in proximately to each other, thereby securing the top to the base.

15. The apparatus of claim 14, wherein at least one protrusion from the coupling clips has a sloped side that extends from an end of the shoulder and at least part of the sloped side forms an acute angle with the shoulder.

16. The apparatus of claim 8, wherein the apparatus is an electronic apparatus.

17. The apparatus of claim 16, wherein the electronic apparatus is a set-top box.

18. A method comprising:

pushing a base and top together by applying a vertical force;

simultaneously contacting coupling clips of the top with clip receiving members of the base;

laterally repositioning grasping portions of the coupling clips; and snapping the grasping portions into their initial lateral positions or some intermediate positions, such that there is a lateral and vertical overlap of portions of the coupling clips and part of the clip receiving members which causes the top and base to be reversibly assembled;

aligning a release fixture to the base;

applying a vertical linear force to the release fixture to cause a plurality of decoupling members extending from a plate of the release fixture to enter apertures of the base;

simultaneously contacting the decoupling members to the grasping portions;

laterally repositioning the grasping portions of the coupling clips to disengage the grasping portions; and lifting off the top.

* * * * *